(12) United States Patent
Tsunemi et al.

(10) Patent No.: US 8,253,213 B2
(45) Date of Patent: Aug. 28, 2012

(54) PHOTOELECTRIC CONVERSION ELEMENT, PHOTOELECTRIC CONVERSION ELEMENT ASSEMBLY AND PHOTOELECTRIC CONVERSION MODULE

(75) Inventors: Akiko Tsunemi, Osaka (JP); Satoshi Okamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/313,483

(22) Filed: Dec. 7, 2011

(65) Prior Publication Data
US 2012/0133015 A1 May 31, 2012

Related U.S. Application Data

(62) Division of application No. 12/674,967, filed as application No. PCT/JP2008/063421 on Jul. 25, 2008, now Pat. No. 8,093,675.

(30) Foreign Application Priority Data

Aug. 31, 2007 (JP) ................................. 2007-226328

(51) Int. Cl.
*H01L 31/00* (2006.01)
(52) U.S. Cl. .......... 257/448; 257/21; 257/431; 257/462; 257/621; 257/E31.124
(58) Field of Classification Search .................. 257/448, 257/21, 431, 462, 621, E31.124
See application file for complete search history.

(56) References Cited

U.S. PATENT DOCUMENTS

| 5,468,652 A | 11/1995 | Gee |
| 6,384,317 B1 | 5/2002 | Kerschaver et al. |
| 2005/0172996 A1 | 8/2005 | Hacke et al. |
| 2012/0133015 A1* | 5/2012 | Tsunemi et al. ............. 257/448 |

FOREIGN PATENT DOCUMENTS

| JP | 2-52362 | 4/1990 |
| JP | 2002-500825 | 1/2002 |
| JP | 2007-521668 | 8/2007 |
| WO | WO 2006/029250 | 3/2006 |

OTHER PUBLICATIONS

International Search Report for PCT/JP2008/063421, mailed Oct. 28, 2008.

(Continued)

*Primary Examiner* — Jack Chen
(74) *Attorney, Agent, or Firm* — Nixon & Vanderhye, P.C.

(57) ABSTRACT

A photoelectric conversion element of the present invention comprises: a first semiconductor layer of a first conductivity type; a first electrode arranged on the back side of the first semiconductor layer a second semiconductor layer of a second conductivity type, the second semiconductor layer on the light-receiving side of the first semiconductor layer; a light-receiving face-side electrode provided on the light-receiving side of the second semiconductor layer; a second electrode arranged on the back side of the first semiconductor layer, and electrically separated from the first semiconductor layer, but connected to the second semiconductor layer; and a penetrating-connecting section penetrating the first semiconductor layer, and connecting the light-receiving face-side electrode with the second electrode, wherein the photoelectric conversion element is characterized in that the first electrode and the second electrode are arranged equidistantly apart from a central axis passing through a center of the photoelectric conversion element.

10 Claims, 8 Drawing Sheets

OTHER PUBLICATIONS

Granek, F. et al., "A Systematic Approach to Reduce Process-Induced Shunts in Back-Contacted Mc-Si Solar Cells", IEEE $4^{th}$ World Conference on Photovoltaic Energy Conversion, (May 7-12, 2006), pp. 1319-1322.

De Jong et al., P.C. et al., "Single-Step Laminated Full-Size PV Modules made with Back-Contacted MC-SI Cells and Conductive Adhesives", $19^{th}$ European Photovoltaic Solar Energy Conference, (2004), pp. 2145-2148.

Van Kerschaver et al, "Record High Performance Modules Based on Screen Printed MWT Solar Cells", Conference Record of the Twenty-Ninth IEEE Photovoltaic Specialists Conference, Jun. 2002, pp. 78-81.

* cited by examiner

PHOTOELECTRIC CONVERSION ELEMENT, PHOTOELECTRIC CONVERSION ELEMENT ASSEMBLY AND PHOTOELECTRIC CONVERSION MODULE

This application is a divisional application of U.S. patent application Ser. No. 12/674,967 filed Feb. 24, 2010, now U.S. Pat. No. 8,093,675 which is the U.S. national phase of International Application No. PCT/JP2008/063421 filed 25 Jul. 2008 which designated the U.S. and claims priority to Japan Application No. 2007-226328 filed 31 Aug. 2007, the entire contents of each of which are hereby incorporated by reference.

TECHNICAL FIELD

The present invention relates to a photoelectric conversion element, a photoelectric conversion element assembly, and a photoelectric conversion module.

BACKGROUND ART

In recent years, expectations for photoelectric conversion elements that directly convert sunlight energy into electric energy have been rapidly increased as a next generation of energy sources particularly from the viewpoint of environmental issues. Currently mainstream photoelectric conversion elements use silicon crystals.

Among them, an MWT (Metallization Wrap Through) photoelectric conversion element has been proposed in order to decrease the area occupation rate of a surface electrode and inhibit carrier recombination in an area below the surface electrode (Non-Patent Document 1). This MWT photoelectric conversion element has a structure in which a part of the surface electrode is arranged on the back side via a through-hole formed in a silicon substrate to allow decrease of the area occupation rate of the surface electrode.

A p-side electrode at a back side of one MWT photoelectric conversion element is connected with an n-side electrode at a back side of an adjacent MWT photoelectric conversion element by use of an interconnection foil to form a photoelectric conversion element assembly (Non-Patent Document 2). The interconnection foil has a patterned aluminum layer, and a surface of one part where the aluminum layer is electrically connected to each electrode at the back side of the MWT photoelectric conversion element is worked up so that an anti-corrosion layer is formed thereon, and the other part is coated with an isolating varnish. Conduction between each electrode at the back side of the MWT photoelectric conversion element and the anti-corrosion layer is made via a conductive adhesive.

Non-Patent Document 1: "A SYSTEMATIC APPROACH TO REDUCE PROCESS-INDUCED SHUNTS IN BACK-CONTACTED MC-SI SOLAR CELLS", IEEE 4th World Conference on Photovoltaic Energy Conversion, U.S.A., 2006, pages 1319-1322, Filip Granek et al.

Non-Patent Document 2: "SINGLE-STEP LAMINATED FULL-SIZE PV MODULES MADE WITH BACK-CONTACTED MC-SI CELLS AND CONDUCTIVE ADHESIVES", 19th European Photovoltaic Solar Energy Conference, France, 2004, pages 2145-2148, P. C. de Jong et al.

DISCLOSURE OF THE INVENTION

Problems to be Solved by the Invention

Since the interconnection foil has complicated patterning, it is necessary to arrange the photoelectric conversion element on the interconnection foil with a high positioning accuracy in order to avoid trouble such as defective connection between the interconnection foil and the MWT photoelectric conversion element. Furthermore, the conductive adhesive and the production process of the interconnection foil cost more than an inter-connector.

In view of such circumstances, the present invention has been achieved to provide a photoelectric conversion element that allows connection between adjacent photoelectric conversion elements by use of an inexpensive wiring member.

Means for Solving the Problems and Effects of the Invention

A photoelectric conversion element of the present invention comprises: a first semiconductor layer of a first conductivity type; a first electrode arranged on the back side of the first semiconductor layer and electrically connected to the first semiconductor layer; a second semiconductor layer of a second conductivity type, the second semiconductor layer brought into contact with the first semiconductor layer and arranged at least in part on the light-receiving side of the first semiconductor layer; a light-receiving face-side electrode provided so as to be electrically connected to the second semiconductor layer on its light-receiving side; a second electrode arranged on the back side of the first semiconductor layer, and electrically separated from the first semiconductor layer, but electrically connected to the second semiconductor layer; and a penetrating-connecting section penetrating the first semiconductor layer, and electrically separated from the first semiconductor layer, but electrically connecting the light-receiving face-side electrode with the second electrode, wherein the photoelectric conversion element is characterized in that the first electrode and the second electrode are arranged equidistantly apart from a central axis passing through a center of the photoelectric conversion element.

In the present invention, the first electrode and the second electrode are arranged equidistantly apart from the central axis passing through the center of the photoelectric conversion element. Therefore, when two photoelectric conversion elements are arranged side by side and electrically connected to each other, and one photoelectric conversion element is turned around an axis perpendicular to the principal surface by 180 degrees, and then the central axes of each element are arranged on the same straight line, the first electrode of one photoelectric conversion element and the second electrode of the other photoelectric conversion element will necessarily be positioned on a straight line parallel to the central axes. Accordingly, the first electrode of one photoelectric conversion element and the second electrode of the other photoelectric conversion element can be connected by use of a linear inter-element wiring member. Since two photoelectric conversion elements can be connected by use of a linear inter-element wiring member according to the present invention, the period of time for this wiring process can be shortened. In addition, linear inter-element wiring members are relatively inexpensive, and therefore production costs can be reduced.

Hereinafter, various embodiments of the present invention will be exemplified.

The second electrode may have an asymmetrical shape with respect to the center point of the penetrating-connecting section.

A distance between the first electrode and the central axis, and a distance between the penetrating-connecting section and the central axis may be different from each other.

The second electrode may be plural, the plural second electrodes being arranged along a direction parallel to the central axis.

The first electrode may be plural, the plural first electrodes being arranged along a direction parallel to the central axis.

There may be pairs of electrodes, each pair consisting of the first electrode and the second electrode arranged equidistantly apart from the central axis.

The present invention also provides a photoelectric conversion element assembly comprising: a first photoelectric conversion element; and a second photoelectric conversion element, each of which comprises: a first semiconductor layer of a first conductivity type; a first electrode arranged on the back side of the first semiconductor layer and electrically connected to the first semiconductor layer; a second semiconductor layer of a second conductivity type, the second semiconductor layer brought into contact with the first semiconductor layer and arranged at least in part on the light-receiving side of the first semiconductor layer; a light-receiving face-side electrode provided so as to be electrically connected to the second semiconductor layer on its light-receiving side; a second electrode arranged on the back side of the first semiconductor layer, and electrically separated from the first semiconductor layer, but electrically connected to the second semiconductor layer; and a penetrating-connecting section penetrating the first semiconductor layer, and electrically separated from the first semiconductor layer, but electrically connecting the light-receiving face-side electrode with the second electrode, wherein the first electrode of one photoelectric conversion element and the second electrode of another photoelectric conversion element are electrically connected by use of a linear inter-element wiring member.

The present invention also provides a photoelectric conversion element assembly comprising: a first photoelectric conversion element and a second photoelectric conversion element, wherein each of the first and second photoelectric conversion elements is the above-described photoelectric conversion element, the central axes of the first and second photoelectric conversion elements are arranged on the same straight line, and the first electrode of one photoelectric conversion element and the second electrode of the other photoelectric conversion element are arranged so as to be positioned on a straight line parallel to the central axes, and the first electrode of one photoelectric conversion element and the second electrode of the other photoelectric conversion element are electrically connected by use of a linear inter-element wiring member.

The second electrode may have an asymmetrical shape with respect to the center point of the penetrating-connecting section.

In each photoelectric conversion element, a distance between the first electrode and the central axis, and a distance between the penetrating-connecting section and the central axis may be different from each other.

The present invention also provides a photoelectric conversion module comprising the above-described photoelectric conversion element assembly.

The various embodiments shown herein may be combined with one another.

DESCRIPTION OF THE REFERENCE NUMERALS

1 First semiconductor layer (p-type layer)
2 First electrode
3 Second semiconductor layer (n-type layer)
5 Light-receiving face-side electrode
5a Base part of light-receiving face-side electrode
5b Branch part of light-receiving face-side electrode
5c Wide part of light-receiving face-side electrode
7 Second electrode
9 Penetrating-connecting section
9a Through-hole
10 Photoelectric conversion element
10a First photoelectric conversion element
10b Second photoelectric conversion element
11 Central axis
13 Aluminum electrode
15 High-concentration p-type layer
17 Inter-element wiring member
19 Separation band
21 Junction isolation section
23 Antireflection film
25 P-type semiconductor substrate

BEST MODE FOR CARRYING OUT THE INVENTION

Hereinafter, various embodiments of the present invention will be described with reference to the drawings. The contents shown in the drawings and the following description are exemplification, and the scope of the present invention is not limited to the contents shown in the drawings and the following description. Hereinafter, the description will be provided taking the case where the first conductivity type is p-type as an example. In addition, reading of the following description while replacing "p-type" with "n-type" as necessary will allow the following description to be basically applicable to the case where the first conductivity type is n-type.

1. First Embodiment

1-1. Configuration of Photoelectric Conversion Element

Figure 1:
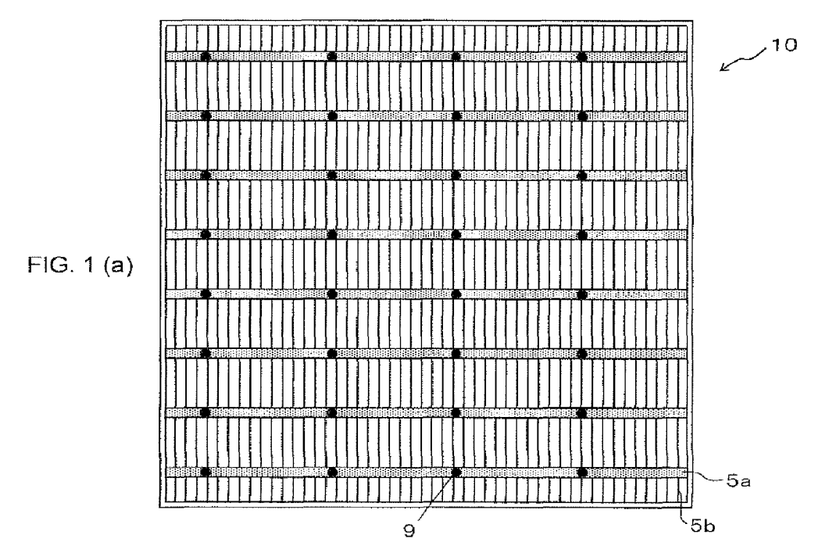
FIGS. 1(a) and 1(b) are a plan view (figure of a light-receiving surface) and a back view, respectively, illustrating a configuration of a photoelectric conversion element in accordance with a first embodiment of the present invention.
Figure 2:
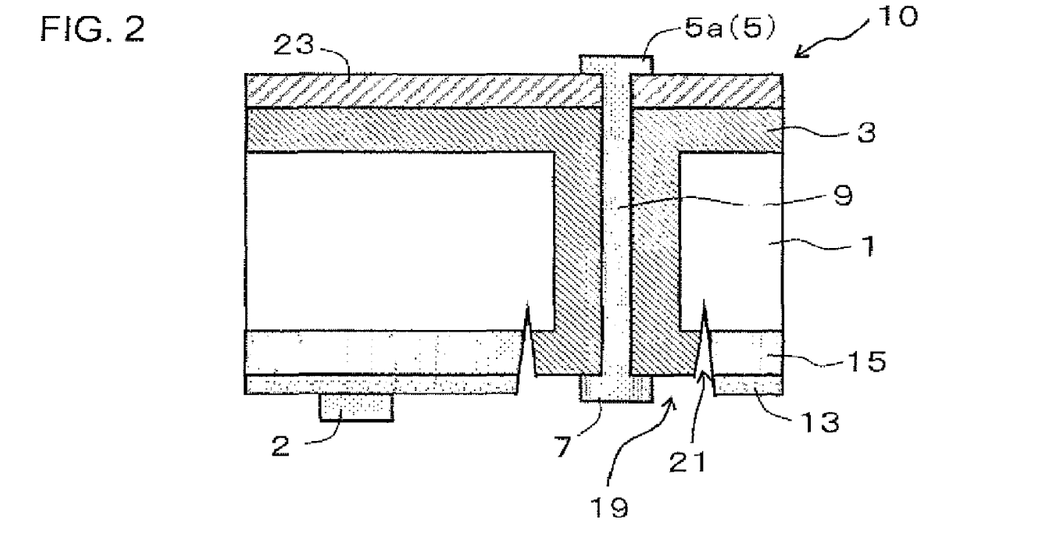
FIG. 2 is a sectional view of the photoelectric conversion element taken along the chain line I-I of FIG. 1(b).

First, the configuration of the photoelectric conversion element in accordance with the first embodiment of the present invention will be described with reference to FIGS. 1(a) and 1(b), and FIG. 2. FIGS. 1(a) and 1(b) are a plan view (figure of a light-receiving surface) and a back view, respectively, illustrating the configuration of the photoelectric conversion element in accordance with this embodiment; and FIG. 2 is a sectional view of the photoelectric conversion element taken along the chain line I-I of FIG. 1(b).

A photoelectric conversion element 10 of this embodiment comprises: a p-type first semiconductor layer 1 (hereinafter, referred to as "p-type layer"); a first electrode 2 arranged on the back side of the p-type layer 1 and electrically connected to the p-type layer 1; an n-type second semiconductor layer 3 (hereinafter, referred to as "n-type layer") brought into contact with the p-type layer 1 and arranged at least in part on the light-receiving side of the p-type layer 1; a light-receiving face-side electrode 5 provided so as to be electrically connected to the n-type layer 3 on the light-receiving side of the n-type layer 3; a second electrode 7 arranged on the back side of the p-type layer 1, and electrically separated from the p-type layer 1, but electrically connected to the n-type layer 3; and a penetrating-connecting section 9 penetrating the p-type layer 1, and electrically separated from the p-type layer 1, but electrically connecting the light-receiving face-side electrode 5 with the second electrode 7.

The first electrode 2 and the second electrode 7 are arranged equidistantly apart from a central axis 11 passing through a center of the photoelectric conversion element 10. The central axis 11 is parallel to a principal surface of the photoelectric conversion element 10. The central axis 11 divides the photoelectric conversion element 10 into two pieces of the same shape in a plan view. When the planar shape of the photoelectric conversion element 10 is a square or a rectangle, the central axis 11 is a straight line that passes through the center of the square or the rectangle and is parallel to one side of the square, or a shorter side or a longer side of the rectangle. The central axis 11 is parallel to a direction in which a plurality of photoelectric conversion elements 10 are arranged to be connected in series.

An aluminum electrode 13 is arranged at the back side of the p-type layer 1. A high-concentration p-type layer 15 in which a high concentration of p-type impurities are doped is formed immediately under the aluminum electrode 13. The first electrode 2 and the second electrode 7 are independently used for connection to different inter-element wiring members 17 (see FIG. 5). A separation band 19 is provided so as to have a circular shape between the second electrode 7 and the aluminum electrode 13. Thereby, the second electrode 7 and the aluminum electrode 13 are insulated. The separation band 19 is provided with a junction isolation section 21 in a circular shape. Thereby, the p-type layer 1 and the n-type layer 3 are insulated securely. An antireflection film 23 is provided at the light-receiving side of the n-type layer 3.

There are provided a plurality of first electrodes 2 and second electrodes 7. The plurality of first electrodes 2 are arranged along a direction parallel to the central axis 11, and so are the plurality of second electrodes 7. A first electrode array consisting of a plurality of first electrodes 2 arranged linearly and a second electrode array consisting of a plurality of second electrodes 7 arranged linearly are in a line-symmetric position with respect to the central axis 11. Instead of arranging the plurality of first electrodes 2 along the direction parallel to the central axis 11, a first electrode 2 having an elongated shape may be arranged so that a longer direction thereof is parallel to the central axis 11. Arrangement of the plurality of first electrodes 2 in a discrete manner brings advantages that the amount of electrode materials to be used can be reduced and that stress to be received from the inter-element wiring member 17 can be reduced. The number of first electrodes 2 and second electrodes 7 may be one, respectively, but the power generated in the photoelectric conversion element 10 can be collected efficiently by arranging a plurality of electrodes in a distributed manner.

There are provided a plurality of (four, specifically) pairs of electrodes, each pair consisting of the first electrode 2 and the second electrode 7 arranged equidistantly apart from the central axis 11. As illustrated in FIG. 1 (b), the distance between the central axis 11 and the first electrode 2 or the second electrode 7 in the first to fourth pairs are A, B, C, D, respectively. The number of the pairs may be one, but the power generated in the photoelectric conversion element 10 can be collected efficiently by providing a plurality of pairs that are different from each other in distance from the central axis 11.

The light-receiving face-side electrode 5 is composed of a base part 5a and a branch part 5b that is electrically connected to the base part 5a and has a width narrower than that of the base part 5a. The width of the base part 5a is constant. The penetrating-connecting section 9 is connected to the base part 5a.

1-2. Method for Producing Photoelectric Conversion Element

Next, an example of the method for producing the photoelectric conversion element 10 will be described with reference to FIGS. 3(a) to 3(d) and FIGS. 4(e) to 4(g).

(1) Step of Forming Through-Hole and Surface Roughening

First, a through-hole 9a is formed in a p-type semiconductor substrate 25 as illustrated in FIG. 3(a). The kind of the substrate 25 is not particularly limited, and examples thereof include a crystalline silicon substrate. The method for forming the through-hole 9a is not particularly limited. The through-hole 9a can be formed by laser beam machining, for example. The shape and dimension of the through-hole 9a are not particularly limited. Examples of the shape of the through-hole 9a include a quadrilateral (for example, square, rectangle) and a circle.

Next, a roughened structure (textured structure) is formed in the surface of the substrate 25 by etching the surface with an acid or alkaline solution, or reactive plasma.

(2) Step of Forming N-Type Layer

Next, the n-type layer 3 is formed by introducing n-type impurities to the substrate 25 as illustrated in FIG. 3(b) to obtain the structure illustrated in FIG. 3(b).

The introduction of n-type impurities can be performed by leaving the substrate 25 in a high-temperature gas including a material containing n-type impurities (for example, $POCl_3$), for example. Through this step, the n-type layer 3 is formed at a top side of the substrate 25, on a side wall of the through-hole 9a, and at a back side of the substrate 25. The remaining part in the substrate 25 that is not the n-type layer 3 is the p-type layer 1.

The method for forming the n-type layer 3 is not limited to the method described herein. The n-type layer 3 may be formed by implanting n-type impurity ions into the substrate 25, for example. In addition, the n-type layer 3 may be formed by separately forming an n-type semiconductor layer on the substrate 25 by a CVD method or the like, instead of forming the n-type layer 3 by introducing n-type impurities into the substrate 25. In this case, the substrate 25 itself is the p-type layer 1.

The n-type layer 3 should be arranged at least in part on the light-receiving side of the p-type layer 1. Therefore, the n-type layer 3 arranged on the back side of the p-type layer 1 may be left as is or may be removed by etching or the like. Or, formation of the n-type layer 3 on the back side of the p-type layer 1 may be prevented by introducing n-type impurities into the substrate 25 with the use of a diffusion preventing mask previously placed on the back side of the substrate 25.

(3) Step of Forming Antireflection Film

Next, the antireflection film 23 is formed on the light-receiving side of the n-type layer 3 as illustrated in FIG. 3(c).

The antireflection film 23 can be formed on the light-receiving side of the n-type layer 3 so as to have an opening in a region where the light-receiving face-side electrode 5 is to be formed. The antireflection film 23 may be formed on the whole light-receiving surface of the n-type layer 3. In this case, the light-receiving face-side electrode 5 is formed on the antireflection film 23, and conduction between the light-receiving face-side electrode 5 and the n-type layer 3 can be made by fire-through. The material, thickness, production method, and the like of the antireflection film 23 are not particularly limited, as long as the film has a function of preventing surface reflection. The antireflection film 23 is made of an SiN film having a thickness of 70 nm, for example. The antireflection film 23 can be formed by a plasma CVD method, for example.

(4) Step of Forming Aluminum Electrode and High-Concentration P-Type Layer

Figure 3:
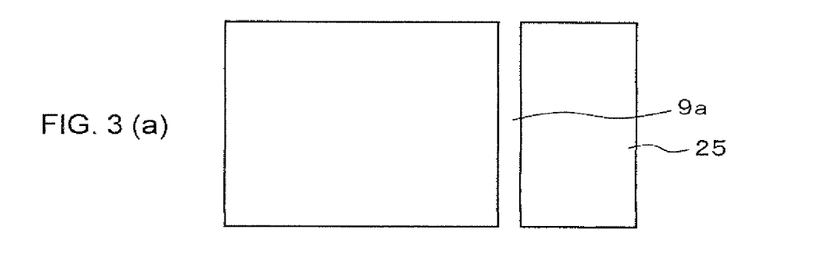
FIGS. 3(a) to 3(d) are sectional views illustrating production steps of the photoelectric conversion element in accordance with the first embodiment of the present invention.
Figure 4:
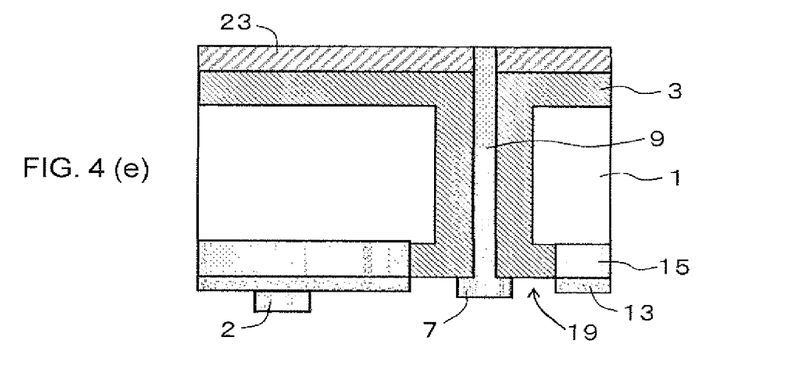
FIGS. 4(e) to 4(g) are sectional views illustrating production steps of the photoelectric conversion element in accordance with the first embodiment of the present invention.

Next, the aluminum electrode 13 is formed on the back side of the p-type layer 1 as illustrated in FIG. 3 (d). The aluminum electrode 13 can be formed by printing and baking a paste material containing aluminum. On this occasion, aluminum diffuses immediately under the aluminum electrode 13 to form the high-concentration p-type layer 15 (see FIG. 4 (e)). The aluminum electrode 13 is formed so as to avoid an area around the through-hole 9a (area where the second electrode 7 and the separation band 19 are to be formed in a following step).

(5) Step of Forming First Electrode, Second Electrode, and Penetrating-Connecting Section Next, as illustrated in FIG. 4 (e), the first electrode 2 and the second electrode 7 are formed on the back side of the p-type layer 1, and the penetrating-connecting section 9 is formed in the through-hole 9a. The second electrode 7 is formed so as to allow the separation band 19 to be provided between the second electrode 7 and the aluminum electrode 13. The materials, thicknesses, production methods, and the like of the first electrode 2, the second electrode 7, and the penetrating-connecting section 9 are not particularly limited. The materials thereof may be the same or different from one another. The first electrode 2, the second electrode 7, and the penetrating-connecting section 9 are preferably formed of a metal suitable for soldering, for example, silver.

The first electrode 2, the second electrode 7, and the penetrating-connecting section 9 can be formed by a vapor deposition method, a printing and baking method with a paste electrode, a plating method, or the like. The second electrode 7 and the penetrating-connecting section 9 can be formed at the same time by a method in which a conductive paste is printed and baked from the back side, for example. The second electrode 7 and the penetrating-connecting section 9 can be formed at the same time also by a vapor deposition method or a plating method.

(6) Step of Forming Light-Receiving Face-Side Electrode

Next, the light-receiving face-side electrode 5 is formed on the light-receiving side of the n-type layer 3 as illustrated in FIG. 4 (f). The shape and material of the light-receiving face-side electrode 5 are not particularly limited, as long as the light-receiving face-side electrode 5 is allowed to be electrically connected to the n-type layer 3 and collect the power generated from the n-type layer 3 in the photoelectric conversion element 10. The light-receiving face-side electrode 5 can be formed of a metal material such as, for example, silver, aluminum, copper, nickel, and palladium, out of which silver is preferable. The light-receiving face-side electrode 5 can be formed by a vapor deposition method, a printing and baking method with a paste electrode, a plating method, or the like, for example.

There will be no problem even if the order of the above-described steps (4), (5), (6) is changed.

(7) Step of Junction Isolation

Next, the junction isolation section 21 is formed in the separation band 19 so as to have a circular shape as illustrated in FIG. 4 (g) to complete production of the photoelectric conversion element 10. The junction isolation section 21 can be formed by laser beam machining, for example.

1-3. Photoelectric Conversion Element Assembly

Figure 5:
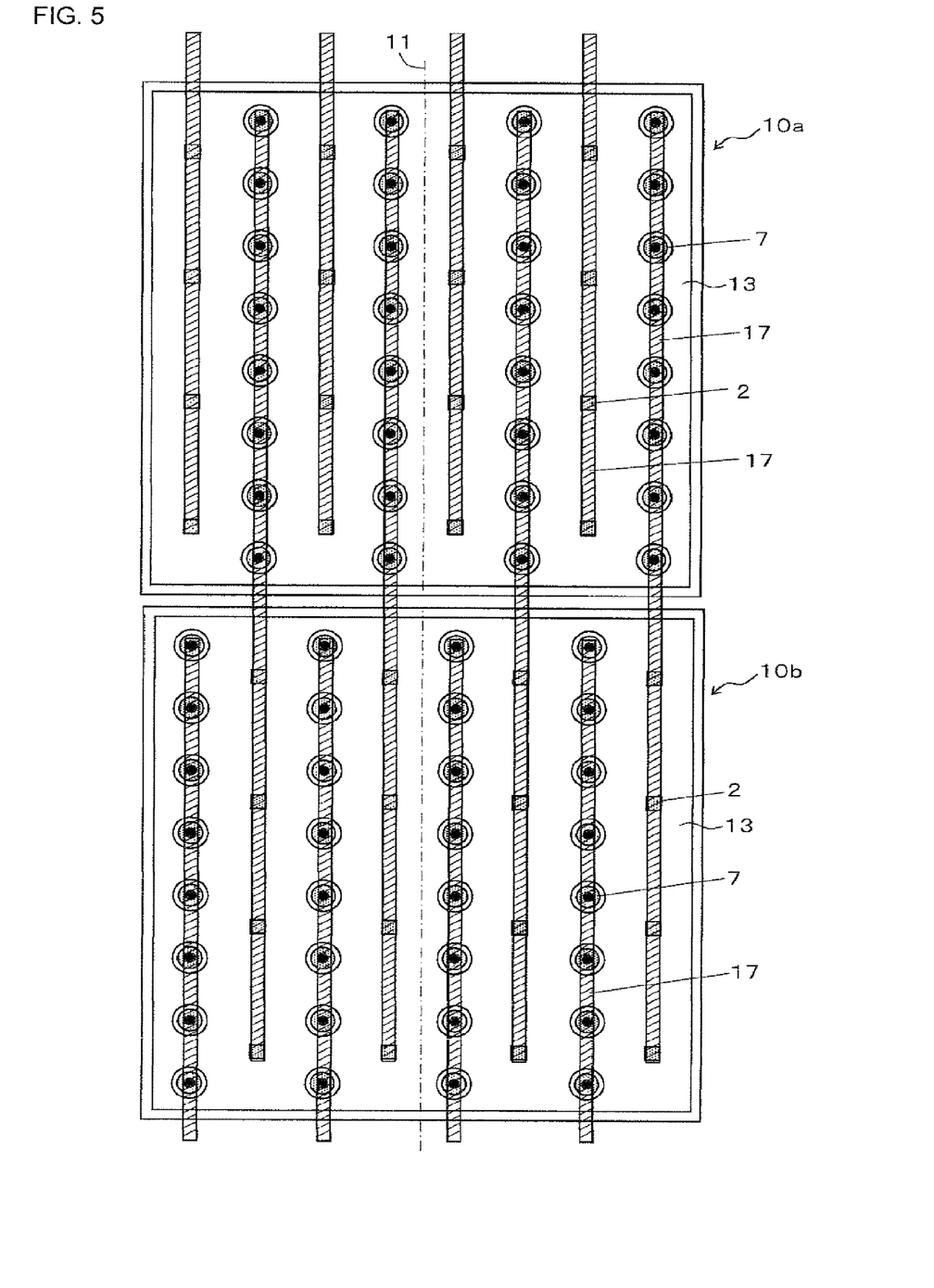
FIG. 5 is a back view illustrating a configuration of a photoelectric conversion element assembly in accordance with the first embodiment of the present invention, corresponding to the photoelectric conversion element shown in FIG. 1(b).

A photoelectric conversion element assembly in accordance with the first embodiment of the present invention will be described with reference to FIG. 5. FIG. 5 is a back view illustrating a configuration of the photoelectric conversion element assembly in accordance with this embodiment of the present invention, corresponding to the photoelectric conversion element shown in FIG. 1(b).

The photoelectric conversion element assembly of this embodiment includes a first photoelectric conversion element 10a and a second photoelectric conversion element 10b. Each of the first and second photoelectric conversion elements 10a, 10b is the above-described photoelectric conversion element of first embodiment. The first and the second photoelectric conversion elements 10a, 10b are arranged so that the central axes 11 of each element are positioned on the same straight line, and the first electrode 2 of one photoelectric conversion element and the second electrode 7 of the other photoelectric conversion element are positioned on a straight line parallel to the central axes 11. The first electrode 2 of one photoelectric conversion element and the second electrode 7 of the other photoelectric conversion element are electrically connected by use of a linear inter-element wiring member 17.

The first electrode 2 and the second electrode 7 are arranged equidistantly apart from the central axis 11 both in the first and second photoelectric conversion elements 10a, 10b. Therefore, one of the first and second photoelectric conversion elements 10a, 10b is turned around an axis perpendicular to the principal surface by 180 degrees, and then the central axes of the first and second photoelectric conversion elements 10a, 10b are arranged on the same straight line, the first electrode 2 of one photoelectric conversion element and the second electrode 7 of the other photoelectric conversion element will necessarily be positioned on a straight line parallel to the central axes. Accordingly, the first electrode 2 of one photoelectric conversion element and the second electrode 7 of the other photoelectric conversion element can be electrically connected by use of the linear inter-element wiring member 17. Since two photoelectric conversion elements can be connected by use of the linear inter-element wiring member 17 according to this embodiment, the period of time for this wiring process can be shortened. In addition, the linear inter-element wiring member 17 is relatively inexpensive, and therefore production costs can be reduced.

The shape and material of the inter-element wiring member 17 are not particularly limited, and examples thereof include a rectangular copper wire having a surface plated with solder.

In addition, it is necessary to take a measure to prevent the second electrode 7 and the neighboring aluminum electrode 13 from being short-circuited by the inter-element wiring member 17. Examples of the measure include: (1) a method in which the surface of the aluminum electrode 13 is coated and insulated at least in a part where the aluminum electrode 13 contacts with the inter-element wiring member 17, and (2) a method in which the surface of the inter-element wiring member 17 is coated and insulated in part. The method (1) provides an effect of shortening of the period of time for the wiring process compared to the art disclosed in Non-Patent Document 2, because the second electrode 7 and the inter-element wiring member 17 can be connected even in the case of less accurate positioning of the second electrode 7 and the inter-element wiring member 17. In the method (1), it is preferable that the surface of the aluminum electrode 13 is further coated and insulated so as to cover an area wider than the width of the inter-element wiring member 17 in terms of shortening of the period of time for the wiring process. The method of coating and insulating is not particularly limited, and examples thereof include a method in which a resin paste is applied by screen-printing.

In FIG. 5, the second electrode 7 of the first photoelectric conversion element 10a and the first electrode 2 of the second photoelectric conversion element 10b are electrically connected by use of the inter-element wiring member 17. The first electrode 2 of the first photoelectric conversion element 10a is electrically connected to the second electrode 7 of a third photoelectric conversion element arranged at a side opposite to the side of the second photoelectric conversion element 10b (upper side of the first photoelectric conversion element 10a in FIG. 5). In addition, the second electrode 7 of the second photoelectric conversion element 10b is electrically connected to the first electrode 2 of a fourth photoelectric conversion element arranged at a side opposite to the side of the first photoelectric conversion element 10a (lower side of the second photoelectric conversion element 10b in FIG. 5). Thus, a photoelectric conversion element assembly in which three or more photoelectric conversion elements are electrically connected in series is obtained.

When four or more photoelectric conversion elements are arranged in a matrix to form a photoelectric conversion element assembly, all the photoelectric conversion elements may be connected in series by use of a bus bar for connecting the inter-element wiring members together in a direction perpendicular to the longer direction of the inter-element wiring members.

4-1. Photoelectric Conversion Module

A photoelectric conversion module of the present invention has the following configuration, for example.

A front cover such as a white plate glass and a filler made of a transparent resin such as EVA (ethylene-vinyl acetate copolymer) are arranged at the light-receiving side of the photoelectric conversion element assembly, and a back side filler such as EVA and a weather-resistant film having a sandwich structure of, for example, insulator/metallic foil/insulator are arranged at the back side of the photoelectric conversion element assembly. To the wiring members at the both ends of the serial connection of the photoelectric conversion element assembly, positive and negative lead wires are connected to take out electric current via bus bars. The lead wires are arranged to reach the back side of the weather-resistant film through through-holes provided in the back side filler and the weather-resistant film.

The photoelectric conversion module of the present invention can be produced as follows, for example.

The filler is arranged on the front cover, and thereon the photoelectric conversion element assembly is arranged with the light receiving surface down. The positive and negative lead wires are connected to the bus bars for connecting the wiring members at the both ends of the serial connection of the photoelectric conversion element assembly. The lead wires are got through the through-hole provided in the back side filler to arrange the back side filler on the photoelectric conversion element assembly. The lead wires are got through the through-hole provided in the weather-resistant film to arrange the weather-resistant film on the back side filler. The filler is melt-solidified by pressurizing and heating this laminate by use of a vacuum laminator to obtain the photoelectric conversion module.

2. Second Embodiment

2-1. Photoelectric Conversion Element

Figure 6:
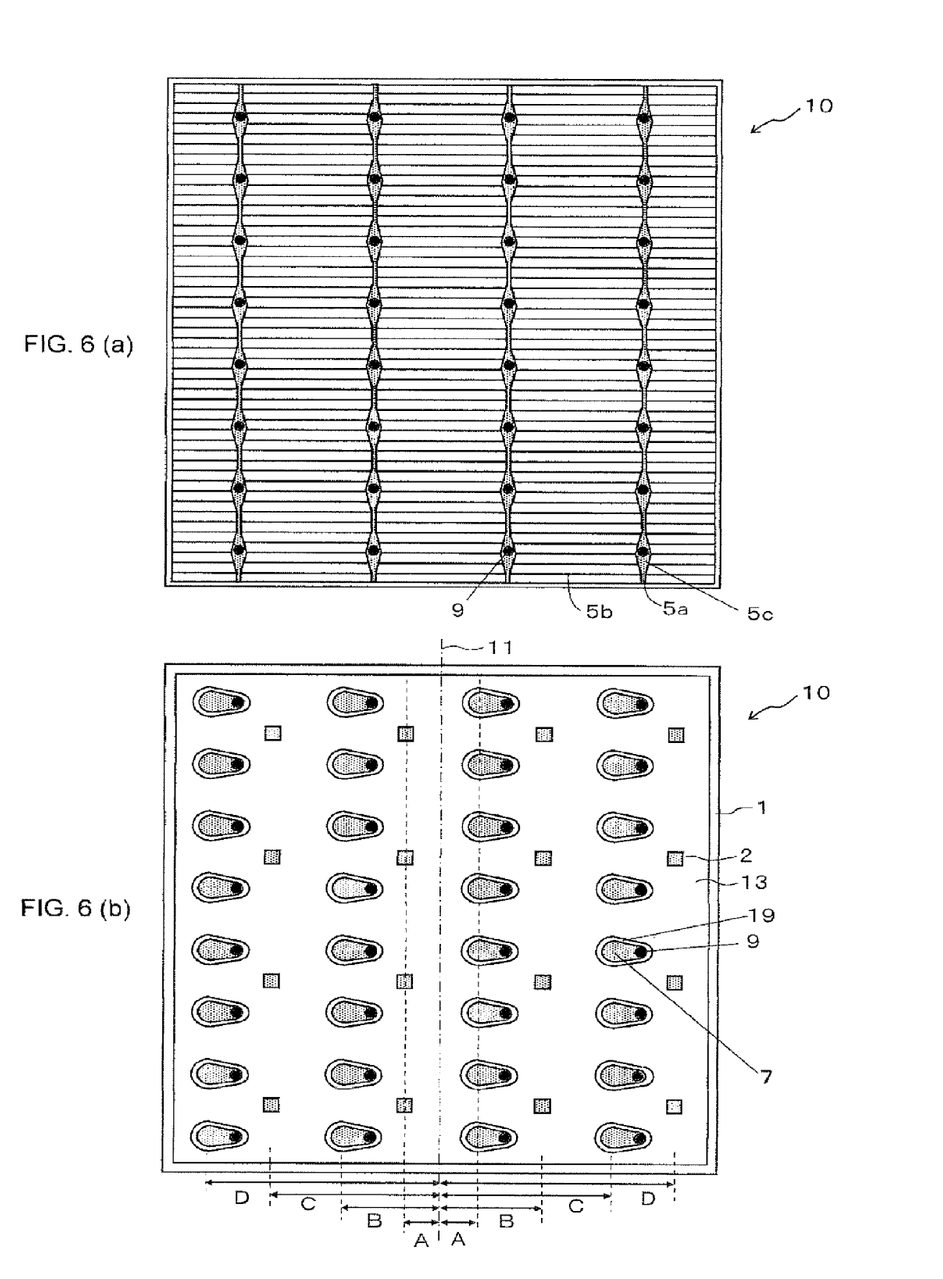
FIGS. 6(a) and 6(b) are a plan view (figure of a light-receiving surface) and a back view, respectively, illustrating a configuration of a photoelectric conversion element in accordance with a second embodiment of the present invention.

A configuration of a photoelectric conversion element of the second embodiment of the present invention will be described with reference to FIGS. 6 (*a*) and 6 (*b*). FIGS. 6 (*a*) and 6 (*b*) are a plan view (figure of a light-receiving surface) and a back view, respectively, illustrating the configuration of the photoelectric conversion element of this embodiment.

The photoelectric conversion element 10 of this embodiment is different from that of the first embodiment mainly in that (1) the second electrode 7 has an asymmetry shape with respect to the center point of the penetrating-connecting section 9; (2) the distance between the first electrode 2 and the central axis 11, and the distance between the penetrating-connecting section 9 and the central axis 11 are different from each other; and (3) the base part 5a of the light-receiving face-side electrode 5 has a wide part 5c in a part to be connected to the penetrating-connecting section 9. Other than that, the second embodiment is basically the same as the first embodiment, and the description of the first embodiment is also true of this embodiment.

Effects to be produced by the above-described differences (1) and (2) will be described later. An effect to be produced by the above-described difference (3) is to enable reduction of the occupation area of the light-receiving face-side electrode 5 while ensuring reliable connection between the light-receiving face-side electrode 5 and the penetrating-connecting section 9. The reduction of the occupation area of the light-receiving face-side electrode 5 enables increase of the light-receiving area.

2-2. Photoelectric Conversion Element Assembly

Figure 7:
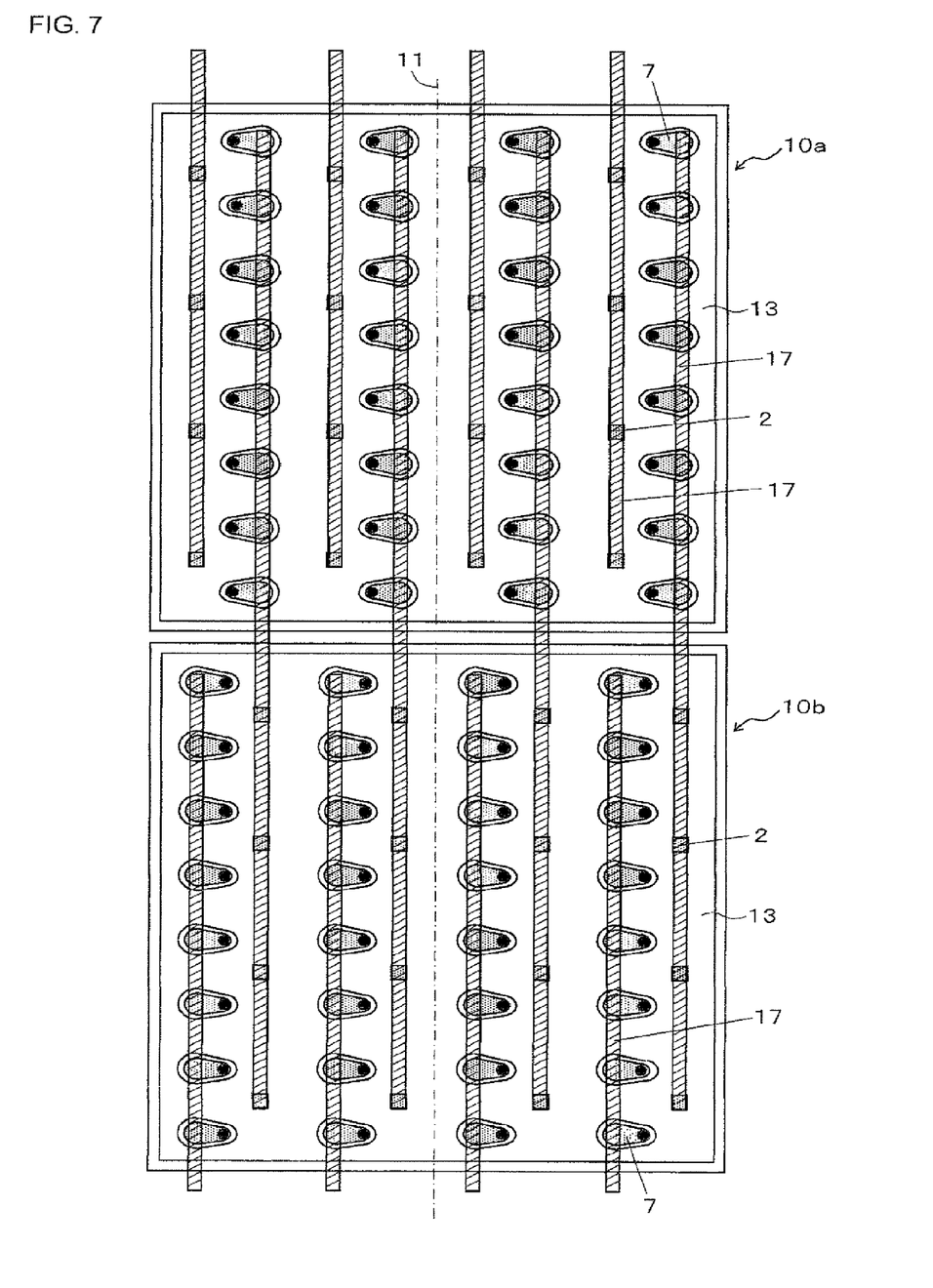
FIG. 7 is a back view illustrating a configuration of a photoelectric conversion element assembly in accordance with the second embodiment of the present invention, corresponding to the photoelectric conversion element shown in FIG. 6(b).

A photoelectric conversion element assembly of the second embodiment of the present invention will be described with reference to FIG. 7. FIG. 7 is a back view illustrating a configuration of the photoelectric conversion element assembly of this embodiment, corresponding to the photoelectric conversion element shown in FIG. 6(*b*).

The photoelectric conversion element assembly of this embodiment is different from the photoelectric conversion element assembly of the first embodiment in that the first and second photoelectric conversion elements 10a, 10b are the above-described photoelectric conversion elements 10a, 10b of the second embodiment, respectively. Other than that, the second embodiment is basically the same as the first embodiment, and the description of the first embodiment is also true of this embodiment.

In the photoelectric conversion element assembly of this embodiment, as well, the first electrode 2 of one photoelectric conversion element and the second electrode 7 of the other photoelectric conversion element can be electrically connected by use of the linear inter-element wiring member 17 as illustrated in FIG. 7.

In the first embodiment, the inter-element wiring member 17 overlaps with the penetrating-connecting section 9 as illustrated in FIG. 5, and the penetrating-connecting section 9 is therefore under stress from the inter-element wiring member 17. In this embodiment, on the other hand, the distance between the first electrode 2 and the central axis 11, and the distance between the penetrating-connecting section 9 and the central axis 11 are different from each other to allow the first electrode 2 and the penetrating-connecting section 9 to be arranged off a straight line parallel to the central axis 11, and the inter-element wiring member 17 can be therefore arranged linearly in a part of the second electrode 7 so as to eliminate overlap with the penetrating-connecting section 9. Accordingly, the penetrating-connecting section 9 is prevented from being under stress from the inter-element wiring member 17.

In addition, as having an asymmetry shape with respect to the center point of the penetrating-connecting section 9, the second electrode 7 can be formed into a shape having a smaller area in the vicinity of the penetrating-connecting section 9 and a larger area in a part contacting with the inter-element wiring member 17 as illustrated in FIG. 7, for example. Thereby, connection strength between the second electrode 7 and the inter-element wiring member 17 can be increased.

3. Third Embodiment

Figure 8:
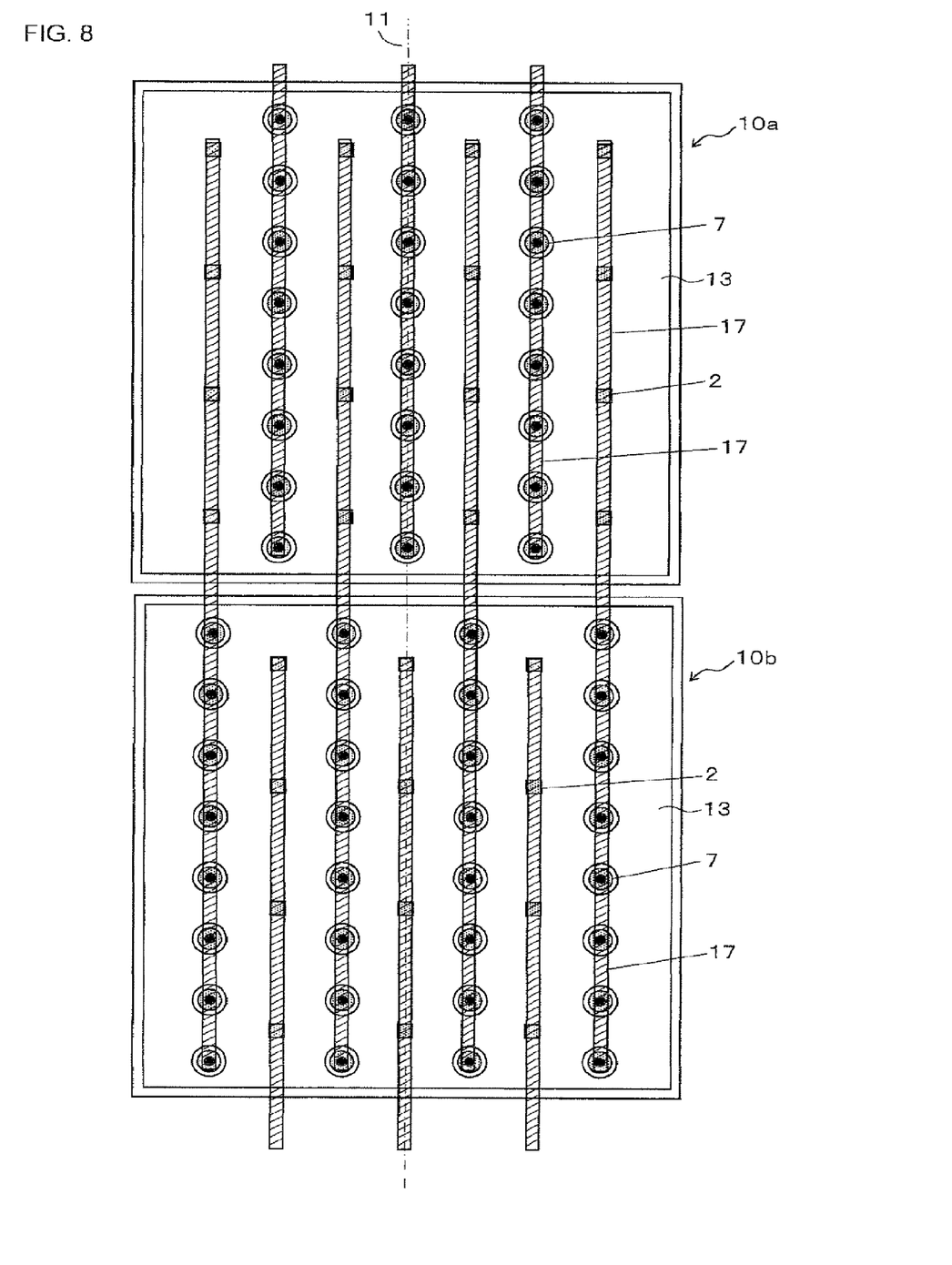
FIG. 8 is a view illustrating a configuration of a photoelectric conversion element assembly in accordance with a third embodiment of the present invention as seen from a back side of a photoelectric conversion element.

A photoelectric conversion element assembly of the third embodiment of the present invention will be described with reference to FIG. 8. FIG. 8 is a view illustrating a configuration of the photoelectric conversion element assembly of this embodiment as seen from a back side of the photoelectric conversion element.

The photoelectric conversion element assembly of this embodiment includes a first photoelectric conversion element 10a and a second photoelectric conversion element 10b that are different from each other in electrode arrangement, and the first electrode 2 of the first photoelectric conversion element 10a and the second electrode 7 of the second photoelectric conversion element 10b are connected by use of the linear inter-element wiring member 17. The first photoelectric conversion element 10a and the second photoelectric conversion element 10b used for this embodiment have a configuration in which the first electrode 2 and the second electrode 7 are arranged linearly in elements adjacent to each other. As for the arrangement of the first electrode 2 and the second electrode 7 within each photoelectric conversion element, it is desirable that the first electrode 2 or the second electrode 7 is arranged on the central line of the element, and the first electrode 2 and the second electrode 7 are arranged at symmetric positions with respect to the central line.

Though this embodiment needs to use two kinds of photoelectric conversion elements, electrode position, that is, wire position of the photoelectric conversion element can be designed with more variance compared with the first embodiment and the second embodiment. In addition, the arrangement of the first electrode 2 and the second electrode 7 at symmetric positions with respect to the central line of the element is advantageous in that the amount of electric current that flows into the inter-element wiring member 17 is even and wiring load can be designed readily in this case.

The various characteristics shown in the above-described embodiments may be combined with one another. For example, the shape of the light-receiving face-side electrode in the first embodiment and the shape of the second electrode in the second embodiment may be combined to be included in one photoelectric conversion element. When one embodiment includes a plurality of characteristics, one, or two or more of the characteristics may be appropriately selected to be applied to the present invention independently or in combination.

The invention claimed is:

1. A photoelectric conversion element, comprising:
a first semiconductor layer of a first conductivity type;
a first electrode arranged on the back side of the first semiconductor layer and electrically connected to the first semiconductor layer;
a second semiconductor layer of a second conductivity type, the second semiconductor layer brought into contact with the first semiconductor layer and arranged at least in part on the light-receiving side of the first semiconductor layer;
a light-receiving face-side electrode provided so as to be electrically connected to the second semiconductor layer on its light-receiving side;
a second electrode arranged on the back side of the first semiconductor layer, and electrically separated from the first semiconductor layer, but electrically connected to the second semiconductor layer; and
a penetrating-connecting section penetrating the first semiconductor layer, and electrically separated from the first semiconductor layer, but electrically connecting the light-receiving face-side electrode with the second electrode,
wherein the photoelectric conversion element is characterized in that the first electrode and the second electrode are arranged equidistantly apart from a central axis passing through a center of the photoelectric conversion element.

2. The element according to claim 1, wherein the second electrode has an asymmetrical shape with respect to a center point of the penetrating-connecting section.

3. The element according to claim 1, wherein a distance between the first electrode and the central axis, and a distance between the penetrating-connecting section and the central axis are different from each other.

4. The element according to claim 1, wherein the second electrode may be plural, the plural second electrodes being arranged along a direction parallel to the central axis.

5. The element according to claim 4, wherein the first electrode may be plural, the plural first electrodes being arranged along a direction parallel to the central axis.

6. The photoelectric conversion element according to claim 5, wherein there are pairs of electrodes, each pair consisting of the first electrode and the second electrode arranged equidistantly apart from the central axis.

7. A photoelectric conversion element assembly, comprising:
a first photoelectric conversion element and a second photoelectric conversion element, wherein each of the first and second photoelectric conversion elements is the photoelectric conversion element according to claim 1, the central axes of the first and second photoelectric conversion elements are arranged on a same straight line, and the first electrode of one photoelectric conversion element and the second electrode of an other photoelectric conversion element are arranged so as to be positioned on a straight line parallel to the central axes, and the first electrode of one photoelectric conversion element and the second electrode of an other photoelectric conversion element are electrically connected by use of a linear inter-element wiring member.

8. The assembly according to claim 7, wherein the second electrode has an asymmetrical shape with respect to a center point of the penetrating-connecting section.

9. The assembly according to claim 7, wherein a distance between the first electrode and the central axis, and a distance between the penetrating-connecting section and the central axis are different from each other in each photoelectric conversion element.

10. A photoelectric conversion module comprising the photoelectric conversion element assembly according to claim 7.

* * * * *